(12) United States Patent
Sakurai

(10) Patent No.: US 10,488,592 B2
(45) Date of Patent: Nov. 26, 2019

(54) OPTICAL POWER ATTENUATOR

(71) Applicant: Santec Corporation, Aichi (JP)

(72) Inventor: Yasuki Sakurai, Aichi (JP)

(73) Assignee: Santec Corporation, Aichi (JP)

( * ) Notice: Subject to any disclaimer, the term of this patent is extended or adjusted under 35 U.S.C. 154(b) by 0 days.

(21) Appl. No.: 15/865,692

(22) Filed: Jan. 9, 2018

(65) Prior Publication Data

US 2018/0259713 A1 Sep. 13, 2018

(30) Foreign Application Priority Data

Mar. 13, 2017 (JP) ................. 2017-047276

(51) Int. Cl.
  *G02B 6/26* (2006.01)
  *G02B 6/35* (2006.01)
  *B81B 7/00* (2006.01)
  *G02B 26/08* (2006.01)
  *G02B 6/02* (2006.01)

(52) U.S. Cl.
  CPC ............ *G02B 6/266* (2013.01); *B81B 7/0077* (2013.01); *G02B 6/3594* (2013.01); *G02B 26/0841* (2013.01); *B81B 2201/042* (2013.01); *G02B 6/02042* (2013.01); *G02B 6/3512* (2013.01)

(58) Field of Classification Search
  None
  See application file for complete search history.

(56) References Cited

U.S. PATENT DOCUMENTS

| | | | | |
|---|---|---|---|---|
| 6,304,709 B1* | 10/2001 | Fujita | ..................... | G02B 6/266 385/140 |
| 6,404,970 B1* | 6/2002 | Gransden | ................. | G02B 5/22 385/140 |
| 6,785,033 B2* | 8/2004 | Meyers | ................... | G02B 6/266 359/237 |
| 7,013,075 B2* | 3/2006 | Morimoto | .............. | G02B 6/266 385/140 |
| 2004/0264907 A1* | 12/2004 | Lee | ......................... | G02B 6/266 385/140 |
| 2007/0031104 A1* | 2/2007 | Chen | ...................... | G02B 6/266 385/140 |

FOREIGN PATENT DOCUMENTS

JP   2004-85869 A   3/2004

\* cited by examiner

*Primary Examiner* — Tina M Wong
(74) *Attorney, Agent, or Firm* — Osha Liang LLP

(57) ABSTRACT

An optical power attenuator includes: a MEMS package storing a MEMS element that can control a reflection angle of light by a mirror; a capillary member provided to one end of a two-core optical fiber that transmits the light and that has an end surface on a side that inputs/outputs the light to the two-core optical fiber tilted at a predetermined angle relative to an optical axis of the two-core optical fiber; and a lens that causes a light emitted from one of the optical fibers of the two-core optical fiber to become incident on the MEMS element via the capillary member and guides the reflected light reflected by the mirror of the MEMS element to the other optical fiber of the two-core optical fiber.

20 Claims, 3 Drawing Sheets

OPTICAL POWER ATTENUATOR

FIELD

The present disclosure relates to an optical power attenuator that attenuates a light using a MEMS element provided with a mirror.

BACKGROUND

To a transmission line configuring a network for optical communication; an optical amplifier provided in this transmission line; or an optical transceiver, an optical transponder, or the like that performs optical communication, an optical power attenuator may be provided to adjust an optical power.

Furthermore, as the optical power attenuator, known is one of a reflective type provided with a MEMS (microelectromechanical-system) element that can control a reflection angle of a mirror that reflects a light according to an applied voltage.

The MEMS element used in the optical power attenuator of the reflective type is provided with the mirror, which is pivotably supported via a beam, and is configured to be able to adjust the reflection angle of the light by the mirror by an electrostatic force arising according to the applied voltage (see for example patent literature 1).

Furthermore, as illustrated in FIG. 5, a conventional optical power attenuator 5 is provided with a MEMS element 10 configured as above, a capillary member 22 provided to one end of a two-core optical fiber 20 for inputting/outputting a light, and a lens 30 disposed between the capillary member 22 and the MEMS element 10.

Furthermore, the lens 30 is configured as a collimating lens; it converts an incident light from an IN-side optical fiber 20*i* among the two-core optical fiber 20 into a collimated light (parallel light), causes this to become incident to the MEMS element 10, and causes a reflected light from the MEMS element 10 to become incident to an OUT-side optical fiber 20*o* in a path different from an incoming path.

Because of this, the incident light from the IN-side optical fiber 20*i* is attenuated according to a reflection angle of the light by a mirror in the MEMS element 10, becomes incident to the OUT-side optical fiber 20*o*, and is transmitted to another optical device via the OUT-side optical fiber 20*o*.

CITATION LIST

Patent Literature

[Patent Literature 1] JP 2004-85869 A

Now, in the capillary member 22, an end surface on a side that input/outputs the light to the two-core optical fiber 20 (in other words, an end surface on a lens-30 side) is configured to be tilted at a predetermined angle relative to an optical axis of the two-core optical fiber 20 so no portion of the light transmitted via the two-core optical fiber 20 is reflected and returns through the same optical path.

Because of this, from the capillary member 22 to the lens 30, the light is emitted diagonally relative to the optical axis of the two-core optical fiber 20. Therefore, when the MEMS element 10 and the capillary member 22 are disposed coaxially with a center axis (optical axis) A of the lens 30, at the MEMS element 10, the incident light from the IN-side optical fiber 20*i* cannot be reflected toward the OUT-side optical fiber 20*o*.

Therefore, in the conventional optical power attenuator 5, as illustrated in FIG. 5, the MEMS element 10 is disposed in a position eccentric from the center axis A of the lens 30. However, when the MEMS element 10 is disposed in this manner, an entirety of a MEMS package 12 wherein the MEMS element 10 is stored needs to be disposed in a position eccentric from the center axis A of the lens 30, and to do this, a diameter R of an entirety of the optical power attenuator 5 must be made greater than a diameter of the lens 30.

However, a size of an optical communication instrument such as an optical amplifier or optical transceiver built-in with an optical power attenuator is restricted by various standards such as CFP, CFP2, CFP4, etc.

Because of this, with the conventional optical power attenuator 5 above, decreasing a size so storage in a case of an optical communication instrument is possible is difficult and it is sometimes the case that storage is impossible in a desired optical communication instrument whose size is restricted.

SUMMARY

In one aspect of the present disclosure, it is desirable to be able to decrease a size of an optical power attenuator that attenuates by reflecting an incident light without degrading attenuation characteristics of an optical power.

An optical power attenuator of one aspect of the present disclosure is provided with a MEMS package storing a MEMS element that can control a reflection angle of a light by a mirror, a capillary member that is provided to one end of a two-core optical fiber that transmits a light and inputs/outputs a light to the two-core optical fiber, and a lens disposed therebetween.

The lens is for causing a light emitted from one of the optical fibers (IN-side optical fiber) of the two-core optical fiber to become incident to the MEMS element via the capillary member and guiding a reflected light reflected by the mirror of the MEMS element to the other optical fiber (OUT-side optical fiber) of the two-core optical fiber.

Furthermore, in the capillary member, an end surface on a side where the light is input/output to the two-core optical fiber is tilted at a predetermined angle relative to an optical axis of the two-core optical fiber. This is to prevent, as with the conventional one above, a portion of the light transmitted via the two-core optical fiber from reflecting at an end surface on a lens side of the capillary member and returning through the same optical path.

Because of this, the light emitted from the IN-side optical fiber of the two-core optical fiber toward the lens is tilted at a predetermined angle relative to an optical axis of the IN-side optical fiber.

Next, to guide the light from the IN-side optical fiber to the OUT-side optical fiber without loss, a center of the capillary member (specifically, a center of a portion that inputs/outputs the light to the two-core optical fiber) needs to be aligned with a center axis (optical axis) of the lens.

Therefore, in one aspect of the optical power attenuator of the present disclosure, centers of the capillary member and the MEMS package are disposed interposing the lens and coaxially with the center axis of the lens.

Furthermore, when the capillary member, the lens, and the MEMS package are disposed coaxially simply with the center axis of the lens, a center position of the mirror of the MEMS element in the MEMS package shifts from an optical axis of the incident light incident via the lens and the incident light cannot be reflected favorably.

Therefore, in one aspect of the optical power attenuator of the present disclosure, in the MEMS package, the MEMS element is disposed in a position where the center position of the mirror of the MEMS element is off from the center axis of the lens and where the incident light from the lens can be reflected toward the lens.

Because of this, according to one aspect of the optical power attenuator of the present disclosure, the capillary member, the lens, and the MEMS package can be disposed coaxially with the center axis of the lens without degrading reflection characteristics of the light by the MEMS element (in other words, attenuation characteristics of an optical power).

Therefore, compared to a conventional device where a MEMS package is disposed in a position eccentric from a center axis of a lens, the optical power attenuator can be decreased in size and, by extension, an optical communication instrument built-in with the optical power attenuator can be decreased in size.

Here, in the MEMS package disposed on the center axis of the lens, to dispose the center position of the mirror of the MEMS element in a position eccentric from the center axis of the lens, the disposition position of the MEMS element in the MEMS package may be shifted from a center position of the MEMS package or a position of the mirror in the MEMS element may be shifted from the center position of the MEMS element.

Next, to further decrease the size of the optical power attenuator, it is favorable to decrease a size of the MEMS package per se; to do this, the MEMS package may be configured so no wiring component that inputs a control signal to the MEMS element is included in a mounting space of the MEMS element.

Furthermore, in the MEMS package, to input the control signal for the MEMS element from outside, instead of providing a wiring component such as an electrode pin as is done conventionally, an electrode pattern for so-called surface mounting may be provided.

Furthermore, by doing so, wiring components provided in the MEMS package can be decreased, the MEMS package can be decreased in size, and, by extension, the optical power attenuator can be further decreased in size.

Note that with a size of a MEMS package configured in this manner, a favorable maximum outline is 3.5 mm or less. That is, in a situation where the MEMS package is cylindrical, it is favorable to make a diameter 3.5 mm and in a situation where the MEMS package is rectangular, it is favorable to make a length of one side 3.5 mm or less. By doing so, the size of the MEMS package can be made smaller than what is generally used conventionally.

Furthermore, in one aspect, in a situation of storing the optical power attenuator of the present disclosure in a case of an optical communication instrument together with another device such as an optical amplifier, in a situation where a diameter and curvature radius of an optical fiber configuring the two-core optical fiber are large, a space necessary to store the two-core optical fiber is large and it is difficult to decrease a size of the optical communication instrument.

Because of this, it is favorable for the two-core optical fiber to be configured by an optical fiber of a curvature radius of 10 mm or less. Moreover, the two-core optical fiber may be configured by an optical fiber with a cladding diameter is 100 μm or less.

By doing so, in one aspect, when storing the optical power attenuator of the present disclosure in the case of the optical communication instrument together with the other optical device such as the optical amplifier, the two-core optical fiber drawn out from the optical power attenuator can be wired readily in a narrow space and the optical communication instrument can be decreased in size.

BRIEF DESCRIPTION OF DRAWINGS

FIG. 2A is a side view, and FIG. 2B is a plan view.

FIG. 3A is an explanatory view representing a state where the mirror is disposed in a center position, and FIG. 3B is an explanatory view representing a state where the mirror is disposed in a position eccentric from the center position.

FIG. 4A is a side view, and FIG. 4B is a bottom view.

DETAILED DESCRIPTION

Figure 1:
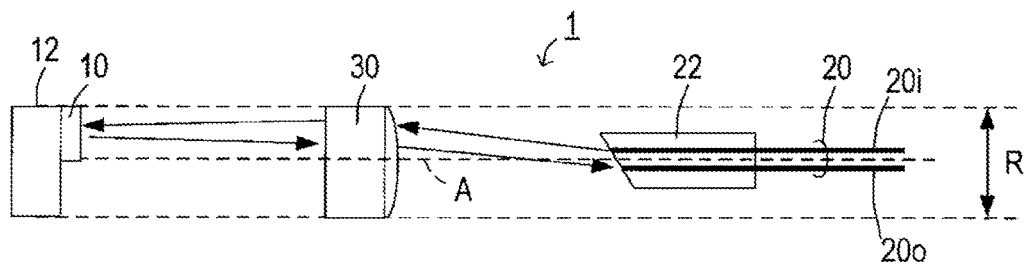
FIG. 1 An explanatory view representing a configuration of an optical power attenuator of one or more embodiments.
Figure 5:
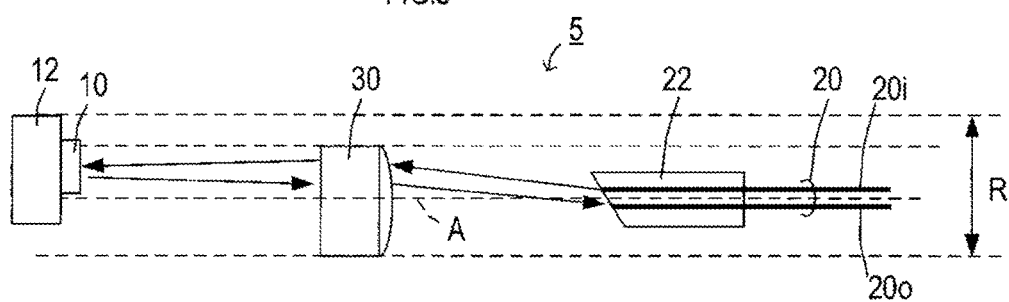
FIG. 5 An explanatory view representing a configuration of a conventional optical power attenuator.

Embodiments of the present invention are described below together with the drawings. As illustrated in FIG. 1, an optical power attenuator 1 of one or more embodiments of the present invention, like the conventional one illustrated in FIG. 5, is provided with a MEMS package 12 storing a MEMS element 10, a capillary member 22 provided to one end of a two-core optical fiber 20, and a lens 30.

The lens 30 is configured as a collimating lens and is disposed between the capillary member 22 and the MEMS element 10. Because of this, a light emitted from an IN-side optical fiber 20$i$ among the two-core optical fiber 20 is converted into a collimated light (parallel light) at the lens 30 and becomes incident to the MEMS element 10 and a reflected light from the MEMS element 10 becomes incident to an OUT-side optical fiber 20$o$ in a path different from an incoming path.

Therefore, the incident light from the IN-side optical fiber 20$i$ is attenuated according to a reflection angle of the light by a mirror in the MEMS element 10, becomes incident to the OUT-side optical fiber 20$o$, and is transmitted to another optical device via the OUT-side optical fiber 20$o$.

Furthermore, in the optical power attenuator 1 of one or more embodiments, so centers of the MEMS package 12 and the capillary member 22 are aligned with a center axis (optical axis) A of the lens 30, the MEMS package 12, the lens 30, and the capillary member 22 are disposed coaxially.

In contrast, an end surface on a lens-30 side of the capillary member 22, like the conventional one illustrated in FIG. 5, is configured to be tilted at a predetermined angle relative to an optical axis of the two-core optical fiber 20.

Because of this, from the capillary member 22, the light from the IN-side optical fiber 20$i$ is emitted diagonally relative to the optical axis of the two-core optical fiber 20 and this light becomes incident to the MEMS package 12 in a position eccentric from the center axis A of the lens 30.

Therefore, in one or more embodiments, so the incident light from the lens 30 can be reflected in a desired direction at the mirror in the MEMS element 10, the MEMS element 10 is disposed in the MEMS package 12 in a position eccentric from a center position of the MEMS package.

As a result, according to the optical power attenuator 1 of one or more embodiments, by positioning the MEMS package 12 relative to the lens 30 and the capillary member 22 by rotating the MEMS package 12 around the center axis A so the light from the IN-side optical fiber 20i becomes incident to a center position of the MEMS element 10, the reflection angle of the light by the MEMS element 10 can be set appropriately. Note that it is sufficient to perform this positioning of the MEMS package 12 around the center axis A when designing the optical power attenuator 1.

Furthermore, because the MEMS package 12 need not be disposed in a position eccentric from the center axis A of the lens 30, a diameter R of an entirety of the optical power attenuator 1 can be made to correspond to a diameter of the lens 30.

Therefore, according to the optical power attenuator 1 of one or more embodiments, a size can be decreased compared to the conventional optical power attenuator 5 illustrated in FIG. 5 and, by extension, an optical communication instrument built-in with the optical power attenuator 1 can be readily decreased in size.

Figure 2A:
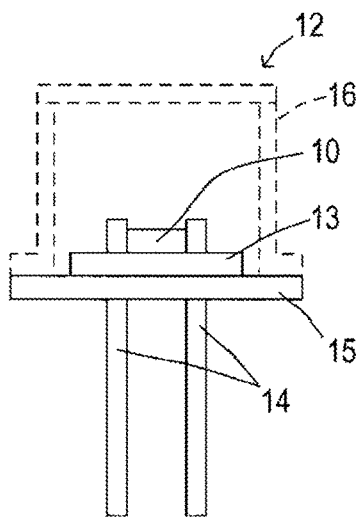
FIGS. 2A and 2B A representation of a configuration example of a MEMS package.
Figure 2B:
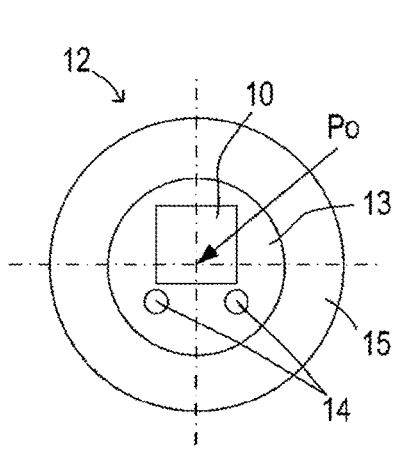

Here, in disposing the MEMS element 10 in the MEMS package 12 in the position eccentric from the center position of the MEMS package 12 as in one or more embodiments, for example, as illustrated in FIGS. 2A and 2B, it is sufficient to dispose the MEMS element 10 on a substrate 13 in the MEMS package 12 in a position eccentric from a center point Po of the substrate 13.

Note that in FIGS. 2A and 2B, provided to the substrate 13 whereon the MEMS element 10 is mounted is a pair of positive and negative electrode pins 14 for applying to the MEMS element 10 a voltage for reflection-angle adjustment (in other words, for electrostatic-force generation). Furthermore, the MEMS element 10 and the substrate 13 are stored in a TO-CAN package configured by a TO header 15 and a TO cap 16, and the electrode pins 14 protrude to the outside from the TO header 15.

Furthermore, in a situation of storing the optical power attenuator 1 in a case of an optical communication instrument such as an optical transceiver, to decrease a size of the optical communication instrument, not only a housing size of the optical power attenuator 1 but also a handling of an optical fiber that is used is an important element.

Therefore, in the power optical attenuator 1 of one or more embodiments, as the IN-side optical fiber 20i and the OUT-side optical fiber 20o configuring the two-core optical fiber 20, so wiring is facilitated in the case of the optical communication instrument, an optical fiber with a small diameter and curvature radius is used.

Specifically, with an optical power attenuator, generally, as an IN-side optical fiber 20i and an OUT-side optical fiber 20o, those with a curvature radius R of 30 mm, a cladding diameter of 125 μm, and a wire of 250 μm is used.

In contrast, in one or more embodiments, as the IN-side optical fiber 20i and the OUT-side optical fiber 20o, an optical fiber with a cladding diameter of 100 μm or less or a curvature radius of 10 mm or less is used. As a result, high-density fiber mounting in a narrow space is possible and a size decrease of the optical communication instrument using the optical power attenuator 1 can be realized.

Note that as the optical fiber with the curvature radius of 10 mm or less, for example, ClearCurve ZBL Optical Fiber made by Corning can be mentioned and as the optical fiber with the cladding diameter of 100 μm or less, for example, RC SMF made by Corning can be mentioned.

Various embodiments of the present invention are described above, but the optical power attenuator of the present invention is not limited to the above embodiments and can be implemented with various modifications.

For example, in one or more of the above embodiments, by disposing the MEMS element 10 in the MEMS package 12 in the position eccentric from the center position of the MEMS package 12 (in other words, the center axis A of the lens 30), desired reflection characteristics (in other words, attenuation characteristics) can be obtained even if the MEMS package 12 is disposed on the center axis A of the lens 30.

In contrast, the MEMS element 10 may be disposed in the center position of the MEMS package 12 and, in the MEMS element 10, a mirror 18 may be disposed in a position eccentric from the center position of the MEMS element 10.

Figure 3A:
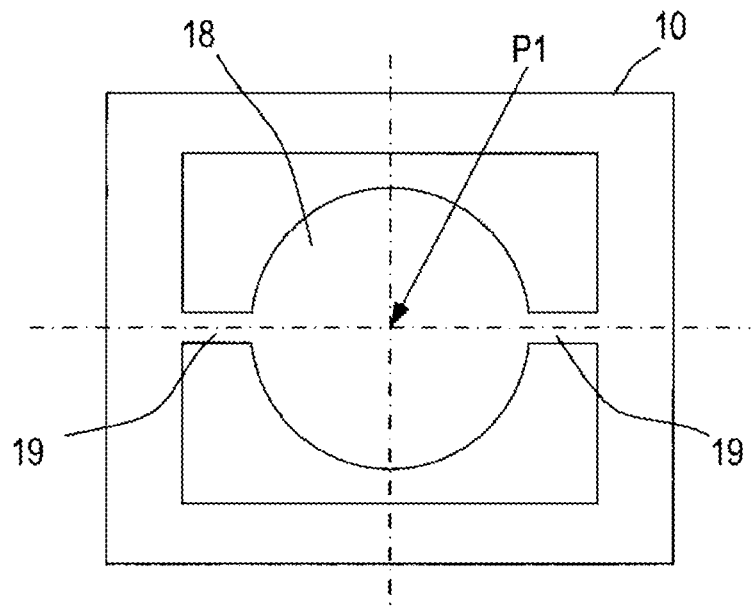
FIGS. 3A and 3B A representation of a disposition of a mirror in a MEMS element.
Figure 3B:
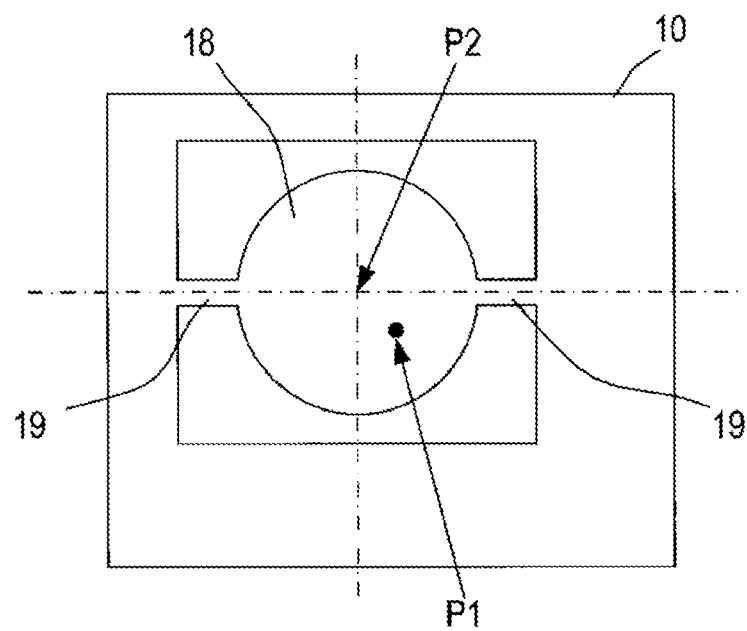

That is, as illustrated in FIG. 3A, in the MEMS element 10, normally, the mirror 18 is normally disposed so a pivoting-center position supported by a beam 19 aligns with a center position P1 of the MEMS element 10. In contrast, as illustrated in FIG. 3B, so a pivoting-center position P2 of the mirror 18 is shifted from the center position P1 of the MEMS element 10, a position of the beam 19 supporting the mirror 18 is changed.

Furthermore, by doing so, even if the MEMS element 10 is disposed in the center position in the MEMS package 12, the center position of the mirror 18 can be shifted from the center position of the MEMS package 12. Therefore, even if the MEMS element 10 is configured as illustrated in FIG. 3B, effects similar to those of one or more of the above embodiments can be obtained.

Meanwhile, in one or more of the above embodiments, the MEMS package 12 is configured as the TO-CAN package and the voltage for driving the MEMS element 10 is input via the electrode pins 14 protruding from the TO header 15 of the MEMS package 12.

Because of this, in a mounting space of the MEMS element 10 in the MEMS package 12, there is no need to provide a wiring component for applying the voltage, which is a control signal, to the MEMS element 10, and by this, the MEMS package 12 can be decreased in size.

However, while the electrode pins 14 are used to connect to a drive circuit for inputting the control signal (drive voltage) to the MEMS package 12 and are suited to mounting the MEMS package 12 to a circuit board assembled with the drive circuit, to ensure a strength, a diameter needs to be increased.

Because of this, when the electrode pins 14 are provided to the MEMS package 12, due to the diameter of the electrode pins 14, it becomes difficult to further decrease the size of the MEMS package 12.

Figure 4A:
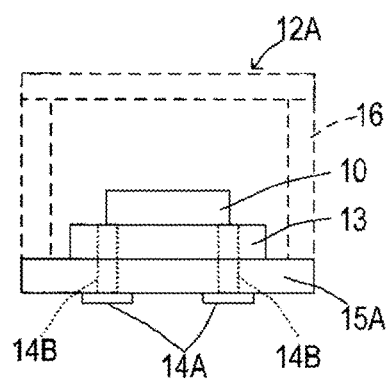
FIGS. 4A and 4B A representation of another configuration example of the MEMS package.
Figure 4B:
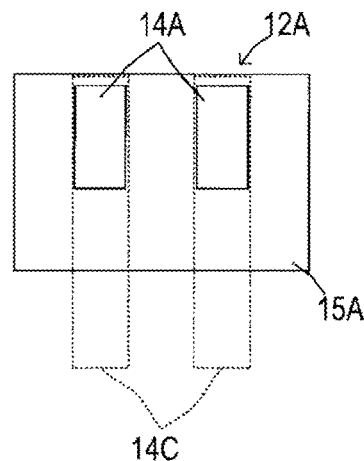

Therefore, to further decrease the size of the MEMS package 12 to decrease the size of the optical power attenuator 1 and, by extension, the optical communication instrument built-in with the optical power attenuator 1, it is favorable to configure the MEMS package 12 as illustrated in FIGS. 4A and 4B.

That is, in a MEMS package 12A illustrated in FIGS. 4A and 4B, a voltage application line of applying the drive voltage to the MEMS element 10 is configured by a pair of through holes 14B that penetrates the substrate 13 and a header 15A. Moreover, on an outer wall (bottom surface) on a header-15A side of the MEMS package 12A, a pair of electrode patterns 14A connected to each through hole 14B is provided.

According to the MEMS package 12A configured in this manner, because there is no need to provide the electrode pins 14, the size can be decreased compared to the MEMS package 12 illustrated in FIGS. 2A and 2B.

Specifically, in optical power attenuators, an outermost diameter of a TO-CAN package currently being used is about 3 to 5 mm, but by configuring the MEMS package 12A as illustrated in FIGS. 4A and 4B, a maximum outer diameter can be made to be 3.5 mm or less. Moreover, in this situation, a shape of the MEMS package 12A can be made cylindrical or, as illustrated in FIGS. 4A and 4B, rectangular.

Furthermore, as illustrated in FIG. 4B, by connecting electrode pins 14C or electrode lead frames (not illustrated) to the electrode patterns 14A, the MEMS package 12A can be used similarly to one configured by the TO-CAN package and the like.

Furthermore, a plurality of functions had by one component in one or more of the above embodiments may be realized by a plurality of components and one function had by one component may be realized by a plurality of components. Moreover, a plurality of functions had by a plurality of components may be realized by one component and one function realized by a plurality of components may be realized by one configuration. Moreover, a portion of the configuration of one or more of the above embodiments may be omitted. Moreover, at least a portion of the configuration of one or more of the above embodiments may be added to or substituted in another configuration of one or more of the above embodiments. Note that all aspects included in the technical idea specified only by the text given in the scope of patent claims are one or more embodiments of the present invention.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

REFERENCE SIGNS LIST 1, 5 ... optical power attenuator; 10 ... MEMS element; 12, 12A ... MEMS package; 13 ... substrate; 14 ... electrode pin; 14A ... electrode pattern; 14B ... through hole; 14C ... electrode pin; 15 ... TO header; 15A ... header; 16 ... TO cap; 18 ... mirror; 19 ... beam; 20 ... two-core optical fiber; 20$i$ ... IN-side optical fiber; 20$o$ ... OUT-side optical fiber; 22 ... capillary member; 30 ... lens.

What is claimed is:

1. An optical power attenuator, comprising:
   a microelectromechanical system (MEMS) package storing a MEMS element that can control a reflection angle of a light by a mirror;
   a capillary member that is provided to one end of a two-core optical fiber that transmits the light and has an end surface on a side that inputs/outputs the light to the two-core optical fiber tilted at a predetermined angle relative to an optical axis of the two-core optical fiber; and
   a lens that is interposed between the capillary member and the MEMS package and that causes a light emitted from one of the optical fibers of the two-core optical fiber to become incident on the MEMS element via the capillary member and guides the reflected light reflected by the mirror of the MEMS element to the other optical fiber of the two-core optical fiber; wherein
   a center axis of the lens and the optical axis of the two-core optical fiber are collinear and pass through a geometric center of a face of the MEMS package facing the lens, and
   in the MEMS package, the MEMS element is disposed in a position where a geometric center point of a reflecting surface of the mirror does not lie on the center axis of the lens and where the incident light from the lens is reflected toward the lens.

2. The optical power attenuator according to claim 1, wherein the MEMS package is configured so no wiring component that inputs a control signal to the MEMS element is included in a mounting space of the MEMS element.

3. The optical power attenuator according to claim 1, wherein the MEMS package is provided with an electrode pattern for inputting the control signal to the MEMS element from outside.

4. The optical power attenuator according to claim 1, wherein with a size of the MEMS package, a maximum outline is 3.5 mm or less.

5. The optical power attenuator according to claim 1, wherein the two-core optical fiber is configured by an optical fiber of a curvature radius of 10 mm or less.

6. The optical power attenuator according to claim 1, wherein the two-core optical fiber is configured by an optical fiber of a cladding diameter of 100 μm or less.

7. The optical power attenuator according to claim 2, wherein the MEMS package is provided with an electrode pattern for inputting the control signal to the MEMS element from outside.

8. The optical power attenuator according to claim 2, wherein with a size of the MEMS package, a maximum outline is 3.5 mm or less.

9. The optical power attenuator according to claim 3, wherein with a size of the MEMS package, a maximum outline is 3.5 mm or less.

10. The optical power attenuator according to claim 7, wherein with a size of the MEMS package, a maximum outline is 3.5 mm or less.

11. The optical power attenuator according to claim 2, wherein the two-core optical fiber is configured by an optical fiber of a curvature radius of 10 mm or less.

12. The optical power attenuator according to claim 3, wherein the two-core optical fiber is configured by an optical fiber of a curvature radius of 10 mm or less.

13. The optical power attenuator according to claim 4, wherein the two-core optical fiber is configured by an optical fiber of a curvature radius of 10 mm or less.

14. The optical power attenuator according to claim 7, wherein the two-core optical fiber is configured by an optical fiber of a curvature radius of 10 mm or less.

15. The optical power attenuator according to claim 8, wherein the two-core optical fiber is configured by an optical fiber of a curvature radius of 10 mm or less.

16. The optical power attenuator according to claim 9, wherein the two-core optical fiber is configured by an optical fiber of a curvature radius of 10 mm or less.

17. The optical power attenuator according to claim 2, wherein the two-core optical fiber is configured by an optical fiber of a cladding diameter of 100 μm or less.

18. The optical power attenuator according to claim 3, wherein the two-core optical fiber is configured by an optical fiber of a cladding diameter of 100 μm or less.

19. The optical power attenuator according to claim 4, wherein the two-core optical fiber is configured by an optical fiber of a cladding diameter of 100 μm or less.

20. The optical power attenuator according to claim 5, wherein the two-core optical fiber is configured by an optical fiber of a cladding diameter of 100 μm or less.

\* \* \* \* \*